United States Patent [19]

Masuda

[11] Patent Number: 5,252,508
[45] Date of Patent: Oct. 12, 1993

[54] APPARATUS AND METHOD FOR THE FABRICATION OF SEMICONDUCTOR CIRCUITS

[75] Inventor: Eiji Masuda, Kawasaki, Japan
[73] Assignee: Kabushiki Kaisha Toshiba, Kawasaki, Japan
[21] Appl. No.: 747,672
[22] Filed: Aug. 20, 1991
[30] Foreign Application Priority Data
 Aug. 21, 1990 [JP] Japan ................................ 2-218100
[51] Int. Cl.⁵ .......................................... H01L 21/70
[52] U.S. Cl. ........................................ 437/51; 437/8
[58] Field of Search ...................... 437/8, 51; 364/490, 364/491

[56] References Cited
U.S. PATENT DOCUMENTS
 4,956,611 9/1990 Maltiel .................................. 437/8
 5,010,029 4/1991 Liu et al. ............................... 437/8

*Primary Examiner*—Tom Thomas
*Attorney, Agent, or Firm*—Oblon, Spivak, McClelland, Maier & Neustadt

[57] ABSTRACT

A plurality of semiconductor elements or element groups in which the shapes, for example, the channel lengths, are slightly different from each other, are designed in advance, and are then fabricated on a semiconductor substrate. Once the main part of the elements, for example, the channel lengths, have been formed on the substrate, the shapes of these elements are measured. According to the measured data, particular elements or element groups which satisfy the required design values of the elements are selected for wirings and connectings to make products. So, the fabrication yield of the finished procucts, for example, made by the master slice approach or the gate array approach can be greatly improved.

11 Claims, 9 Drawing Sheets

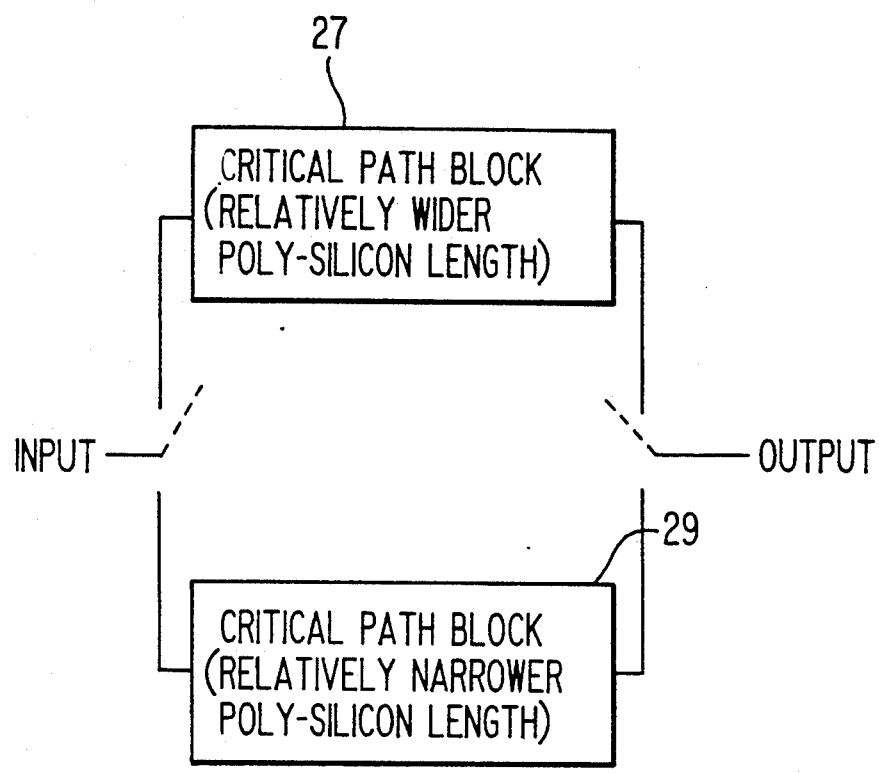
F I G. 6

APPARATUS AND METHOD FOR THE FABRICATION OF SEMICONDUCTOR CIRCUITS

BACKGROUND OF THE INVENTION

1. Field of the invention

This invention relates to an apparatus and method for the fabrication of semiconductor circuits. More particularly, it relates to an apparatus and method for the fabrication of semiconductor circuits, such as MOS semiconductor circuits, which are fabricated by forming semiconductor elements on a semiconductor wafer, and then wiring and connecting the elements to each other.

2. Description of the Prior Art

The technique of wiring semiconductor elements selectively with metal wirings has been called the master slice approach. One example of this technique is disclosed in the Japanese Patent Publication No 1-13223 "Semiconductor Integrated circuits".

The master slice approach has been developed to shorten the period from design to fabrication. This approach, therefore, did not have as its aim to improve the fabrication yield so, of cource, it did not show any effect for this aim.

Japanese Patent Publication No. 1-16013 "A method to determine the routes of wiring patterns" is known as one of the prior arts for improving the fabrication yield by a design phase approach. Following is a summary of this patent. In an LSI having a large scale of logics, the number of wiring patterns is enormous. As a result, the fraction defect by short-circuiting among the patterns increases to cause deterioration of the fabrication yield. In this patent, to prevent the deterioration in the fabrication yield, wiring regions should be divided using straight lines so as to break up patterns dispersed uniformly. The fraction defect by short-circuiting can, then, be reduced. When this technique is applied to LSIs having undergone highly developed fine processes, however, this technique does not prevent the deterioration in the fabrication yield caused by the changes in element characteristics increases as a result of the fabrication variation among elements' shapes or dimensions.

In LSIs having undergone highly developed fine processes, the basic data on how much the change in element characteristics increases or how big the fabrication yield has deteriorated depending on the fabrication variation among elements' shapes, are disclosed in the technical paper by B. Davari, et al., "High Performance 0.25 $\mu$m CMOS Technology", IEDM Technical Digest, pp. 56-59, 1988. Especially in FIG. 5 of this paper, the dependent relation between the saturation transconductance and the effective channel length of sample devices is shown according to measured data. From this figure, it can be seen that the saturation transconductance is about 30 mS/mm for a p-channel FET having a 2.0 $\mu$m effective channel length, 50 mS/mm for a p-channel FET having a 1.0 $\mu$m effective channel length, 85 mS/mm for a p-channel FET having a 0.5 $\mu$m effective channel length, 120 mS/mm for a p-channel FET having a 0.3 $\mu$m effective channel length, and 200 mS/mm for a p-channel FET having a 0.1 $\mu$m effective channel length.

According to the basic data, the device techniques of 2.0 $\mu$m and 0.3 $\mu$m are compared below.

In general, the effective channel length depends on the poly-silicon length in a gate area of an element. This poly-silicon length in a gate area, however, contains some degree of fabrication variation arising from the fabrication precision control in, e.g., the etching process included in the element fabrication processes. Even though much progress has been made in fine fabrication techniques, the fabrication variation mentioned above still exists to some degree. In the equipment of mass production, the variation is usually about ±0.2 $\mu$m. As a result, in the device technique of 2.0 $\mu$m, the saturation transconductance disperses from 25 to 35 mS/mm depending on elements. On the other hand, in the device technique of 0.3 $\mu$m, the transconductance of elements shows a large variation such as from 85 to 200 mS/mm because the difference among channel lengths is from 0.5 to 1.0 $\mu$m in this case. This fact means that the operation speeds of LSIs have a large variation such as more than double the transconductance variation, because the operation speed of an element is proportional to its transconductance. Thus, operation speeds of LSIs cannot be greatly improved even if fine device techniques are highly developed.

The following three problems arise as a result of the variation among operation characteristics, which are caused by the variation among element characteristics, such as operation speed.

First, deterioration of the fabrication yield occurs. The so-called output buffer of an LSI can drive a large outside electrical load, however, this becomes disadvantageous due to the variation among poly-silicon lengths in the gate areas of the elements. In other words, when the element is designed by assuming the maximum and the minimum limits of the variation in the poly-silicon length, the variation range becomes too wide to execute an optimum design. Even if the element is designed by taking into account of the minimum value, it may not be fabricated with the minimum value. That means it may be fabricated with the maximum value. In this case, a proper operation speed of the element cannot be obtained to cause the decline of fabrication yield. On the contrary, in the case where the element is fabricated having the minimum value against the designed value, that is, the maximum value, the drive current of the element becomes too large, and as a result, it causes distortions, such as ringing, in the waveform. This fact results in the waveform of an element departing from the required characteristic, thus causing the decline of the fabrication yield in LSIs.

Second, a difficulty in design for an LSI arises due to the fact that the operation speed of an element cannot be greatly improved. In LSIs, there are some functional modules, in which high operation speeds are required, such as an ALU and an incremental circuit. These modules sometimes determine the operation speed of the whole LSI. In prior arts, such circuits are designed, in general, by assuming the maximum variation value in the poly-silicon channel lengths of gate areas in elements. Although there has been progress in the fine process, element characteristics near the the maximum value haven't been greatly improved, and the required operation speed cannot be obtained easily. Thus, in designing element values, it is too dificalt to arrange the elements and circuits within an effective silicon area. This means that the optimum design for an LSI is difficult to accomplish.

Third, in LSIs made by the master slice approach, the problem of fabrication yield deterioration arises. With the progress made in the fine processes, as mentioned above, the difference between minimum and maximum limits in the gate length variation in elements, of which a cell is composed, becomes so large that the limit speed in operation is greatly varied for each product and lowers the yields of products.

SUMMARY OF THE INVENTION

This invention has been made to overcome the above mentioned problems.

The objective of this invention is, therefore, to provide an apparatus and method for the fabrication of semiconductor circuits in which finished semiconductor circuits can be obtained with a high fabrication or product yield, without being detrimentally affected by variation among elements or element groups dimensions, which are formed before the execution of selection wirings.

Another objective of this invention is to provide an apparatus and method for the fabrication of semiconductor circuits in which products having a certain value of operation limit speeds can be fabricated with a high fabrication yield, without being detrimentally affecting by the shape variation among elements or element groups dimensions, which are formed before the execution of selection wirings, especially in LSIs made by the master slice approach or the gate array approach.

Still another objective of this invention is to provide an apparatus and method for the fabrication of semiconductor circuits in which an optimum design can be executed without any detrimental effects in the variation among elements or element groups dimensions, which are formed before the execution of selection wirings.

One aspect of the present invention is the design, in advance, of a plurality of elements or element groups in which the dimensions are slightly different from each other, and then to fabricate them on a semiconductor wafer. The dimensions of elements or element groups fabricated are then measured to select those which meet the required design values. The selected elements or element groups are then wired to obtain required semiconductor circuits.

According to this aspect, even if there is a large variation among the dimensions of elements or element groups formed on a wafer, those which satisfy the required design values are selected from the original elements or element groups having dimensions slightly different from each other, in order to execute selection wirings. As a result, the semiconductor circuits formed according to the design can be obtained without detrimentally affecting the high fabrication or product yield of the finished products. Furthermore, in order to design a circuit operation speed, there is no need to consider the dimension variations during the element forming stage. Therefore, designs of semiconductor circuits can be easily carried out according to this present invention. As well, products having a certain limit speed can be fabricated with a high fabrication yield in LSIs by the master slice approach and the gate array approach, because the operation speeds of the lastly obtained circuit products are not detrimentally affected by the fabrication variation during the element forming stage.

These and other objects, features and advantages of the present invention will be more apparent from the following description of preferred embodiments, taken in conjunction with the accompanying drawings.

BRIEF DESCRIPTION OF THE DRAWINGS

FIG. 6 is a block diagram showing a circuit with critical paths formed by one fabrication method of the present invention;

DETAILED DESCRIPTION OF PREFERRED EMBODIMENTS

Figure 1:
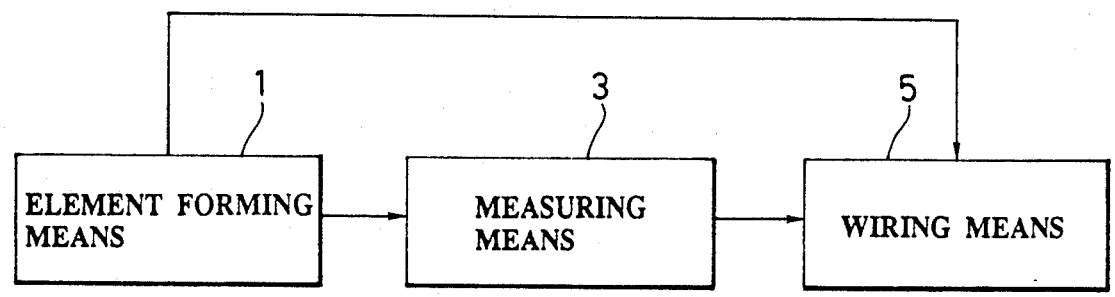
FIG. 1 is a block diagram of the fabrication apparatus for semiconductor circuits according to the present invention.

As shown in FIG. 1, a fabrication apparatus for semiconductor circuits according to the present invention includes the following: element forming means 1, to form a plurality of semiconductor elements or element groups, each of which has a slightly different dimension; measuring means 3, to measure the dimensions of the formed elements; and wiring means 5, to wire and connect the semiconductor elements or element groups selectively according to the measured data from the measuring means 3.

Figure 2:
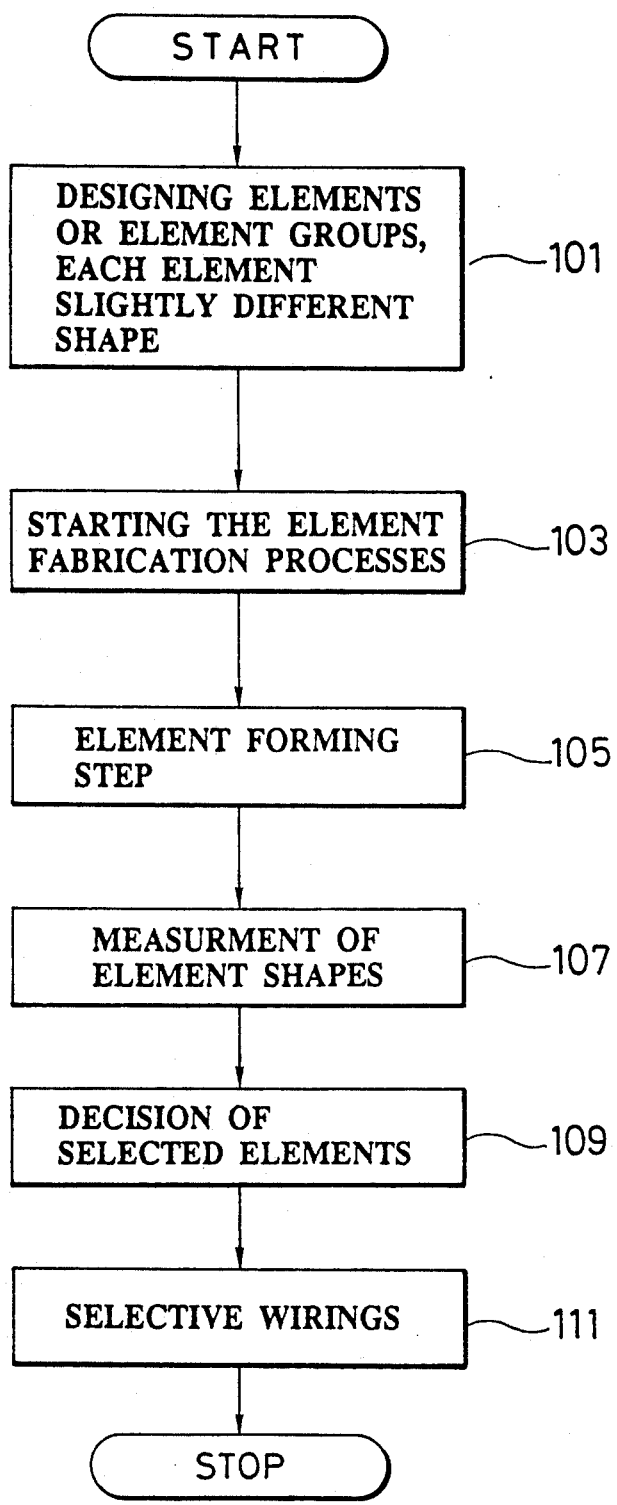
FIG. 2 is a flow chart showing the steps in the semiconductor circuit fabrication processes according to one method of the present invention.

The outline of one fabrication method for semiconductor circuits according to the present invention will be explained below by referring to FIG. 2. Usually, a mask, in which a layout of the arrangement of elements, shapes of elements, wiring patterns among elements, (and so on) are formed, is designed in advance to fabricate semiconductor products which are called VLSI. With the semiconductor fabrication apparatus according to the present invention, the dimensions of elements or element groups, from which the semiconductor circuit is to be formed, are designed in advance at step 101. In MOS processes, for example, circuits in which the gate lengths or the like are slightly different from each other, are designed in advance. Next, the fabrication processes start at step 103 and the main dimensions of the elements are formed at step 105. The dimensions of particular elements formed (usually, elements for monitoring) are measured at step 107. In actuality, particular patterns from which the gate length can be monitored, are measured, for example, by an electrical method or an optical method. At step 109, the circuit to be made, and which has been designed in advance, is selected according to the dimension data measured from the monitored elements. One of the concrete examples of this selection is the mask which is used in the wiring step. The wafer processes still continues and the mask of a selected circuit is applied on the wafer at step 111 so as to make a chip having predetermined functions.

Figure 3:
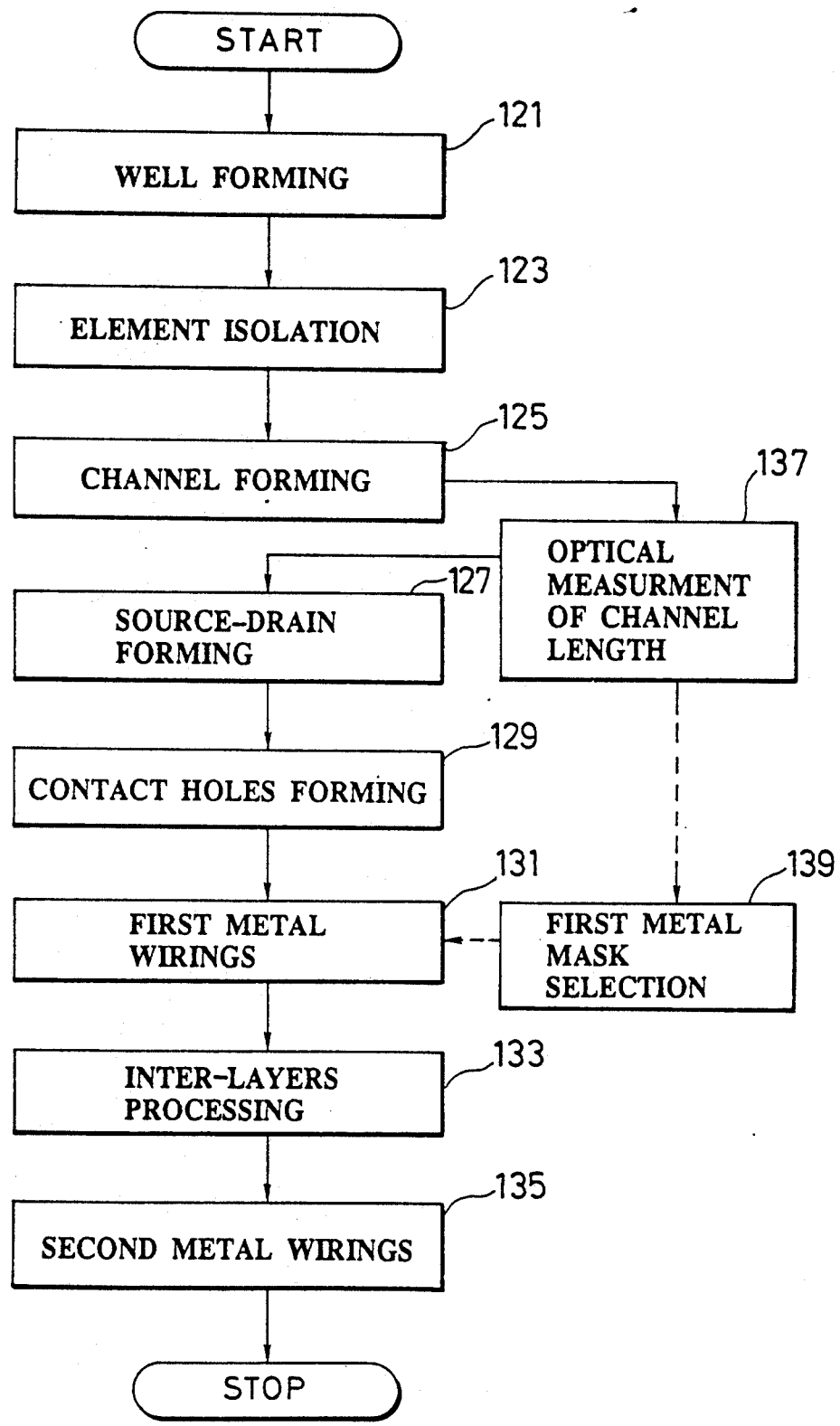
FIG. 3 is a flow chart showing the steps in the fabrication processes of a MOS type semiconductor circuit according to one method of the present invention (i.e., the first embodiment)
Figure 4:
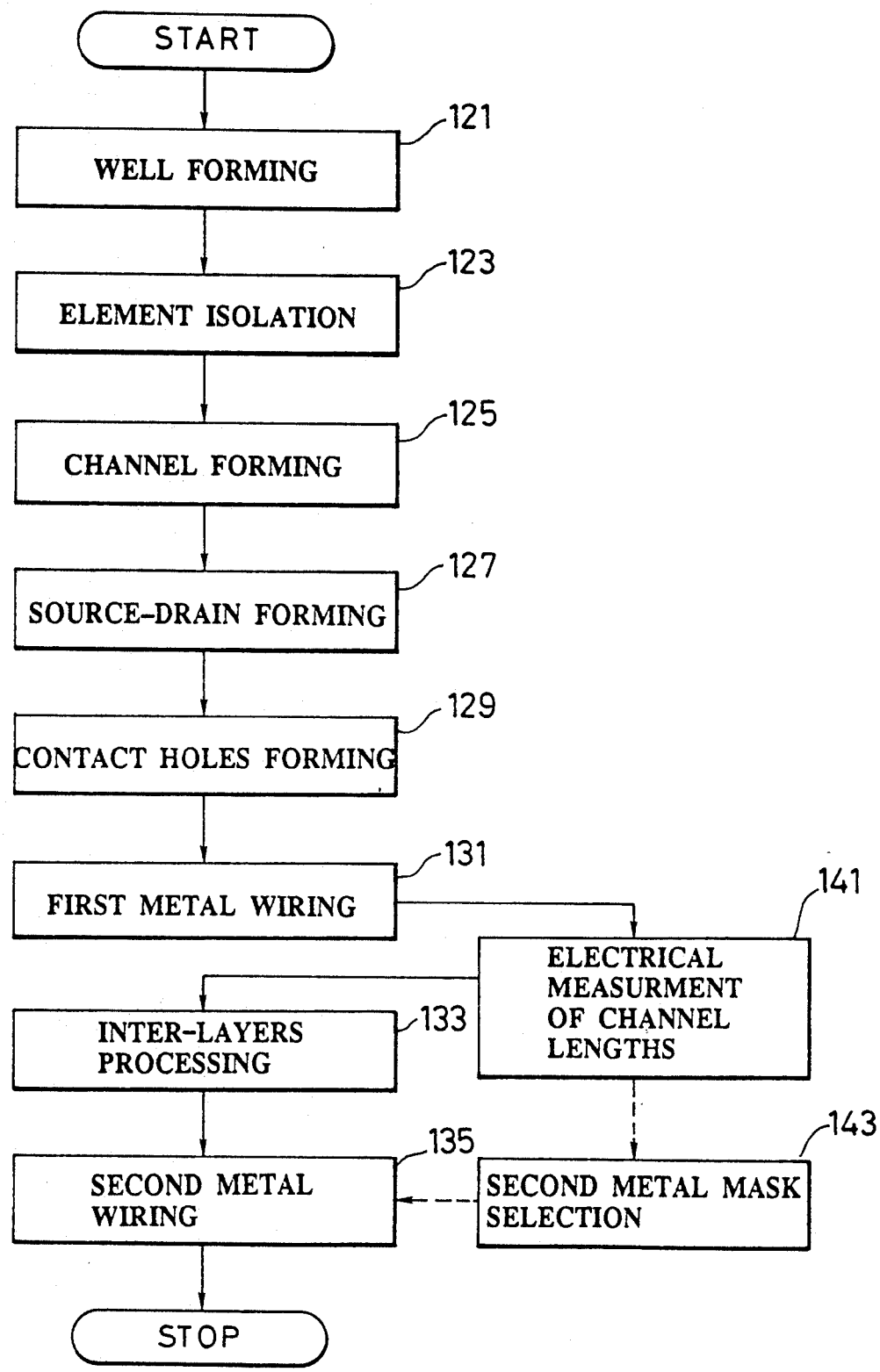
FIG. 4 is a flow chart showing the steps in the fabrication processes of a MOS type semiconductor circuit according to another method of the present invention (i.e., the second embodiment)

FIGS. 3 and 4 show the first and the second embodiments from which MOS type semiconductor apparatuses are made according to methods of the present invention.

In a fabrication method of MOS type semiconductor circuits, in general, the steps proceed in the following sequence: a well forming step; an element isolation step; a channel forming step; a source-drain forming step; a contact hole forming step; a first metal wiring step; an inter-layer processing step; and a second wiring step. These steps are shown from step 121 to step 135 in FIGS. 3 and 4. In the first embodiment shown in FIG. 3, the measurments of element dimensions according to this invention are carried out by measuring the channel length of a MOS device optically, and the selection in the wiring step is carried out by selecting a mask for the first metal. After the completions of the well forming in step 121, the element isolation in step 123, and the channel forming in step 125, the poly-silicon channel lengths of MOS elements are measured optically at step 137. From this measurment, the difference between actual channel length and the expected value, can be detected. That is, information regarding how wide or narrow the actual channel with is in comparison to the expected value, is obtained. According to this detected value, a first metal mask is selected at step 139. Then, the next step returns to the order for fabrication processes for MOS type semiconductor circuits. In other words, source-drain forming step 127, and contact holes forming step 129 are carried out. At step 131, the selected semiconductor elements which have been formed previously are wired and connected using the first metal mask selected in step 139. The inter-layer processing in step 133 and the second metal wiring process in step 135 are then carried out to obtain required MOS type semiconductor circuits.

In the embodiment mentioned above, selected semiconductor elements are wired using the first metal mask. However, this invention should not be limited to this case only. The second metal wiring step, the third metal wiring step, or the mix of these steps can be used instead of the first metal wiring step to wire selected elements. In short, once information regarding channel lengths has been received, any step can be suitable as the selective wiring step.

In the second embodiment shown in FIG. 4, the element dimension measurement step of this invention is carried out by measuring the channel length of MOS elements using electrical methods. Also, the selection in the wiring step is carried out by the selection of a second metal mask. By following the fabrication steps for MOS type semiconductor apparatus in this order, that is, from step 121 to step 131, the fabrication of MOS FET elements including terminal electrodes have been completed. At this time, therefore, the channel lengths of MOS FET elements for monitoring can be measured by electrical methods. One of the methods is to measure the current-voltage characteristics of a MOS FET element directly. In this method, the channel length can be estimated by the driving ability of the element. Another method is to measure the resistivity of the poly-silicon area, of which the channel length is composed, by a monitoring circuit so as to estimate the channel length. In any case, information regarding the channel length, that is, information regarding how wider or narrow the actual channel length is in comparison to the expected value, is detected.

At step 143, a second metal mask is selected according to the information regarding the channel length. Then, the next step returns to the order of the fabrication processes for MOS type semiconductor apparatuses. After the inter-layer processing in step 133, the second metal mask selected at step 143 is applied to the wafer in step 135 so as to wire and connect selected semiconductor elements previouly designed and placed on the wafer. As a result, the required MOS type semiconductor circuits are obtained. In this embodiment, the second metal mask is used to wire and connect selected semiconductor elements. However, this invention is not limited to this use of the second metal mask. The wiring and connecting step can be carried out by the third metal wiring step, fourth metal wiring step, or the mix of these steps. In other words, once information regarding channel lengths has been obtained, any wiring step can be used as the selective wiring step.

Figure 5:
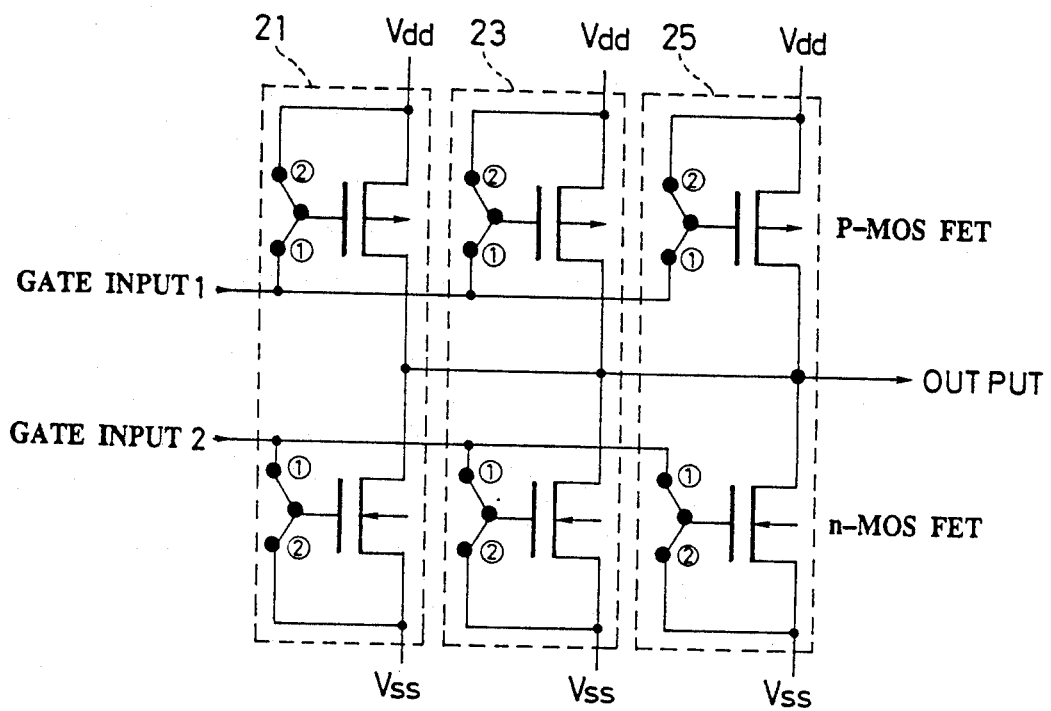
FIG. 5 is a circuit diagram of the MOS type semiconductor output circuit formed by one fabrication method of the present invention.

FIG. 5 is a circuit diagram of a MOS type semiconductor output circuit, which is comprised of elements or element groups, each of which has a slightly different dimension and is fabricated according to one method of this invention.

Usually, in a MOS type semiconductor output circuit, each drain of a p-channel MOS FET and an n-channel MOS FET is connected to form an output while one of the sources of these FETs is connected to a power source and the other is connected to ground. Also, control signals are input to the gates of these FETs. In this embodiment, three MOS FETs 21, 23, and 25, each having almost the same structure except for the channel length, are designed and fabricated in advance. The channel length of MOS FET 21 is slightly longer than the reference value for fabrication, the channel length of MOS FET 23 is the same as that of the reference value, and the channel length of MOS FET 25 is slightly shorter than the reference value. By using a metal wiring mask, the gates of these FETs are, then, selectively connected to input terminals, in which input signals are introduced so as to control these gates. For example, in the case where the expected value of a channel is 0.5 $\mu$m, the channel lengths of these FETs are designed in advance to be 0.6 $\mu$m, 0.5 $\mu$m, and 0.4 $\mu$m. In this situation, when the channels are fabricated slightly wider than the expected value for some reason or other, the connection (2) shown in FIG. 5 is selected for FET 21 and for FET 23, and (1) is selected for FET 25 to carry out metal wirings. As the result of these selections, MOS FET 21 having a 0.4 $\mu$m channel length is selected to connect with the input terminal. On the other hand, if the channels are fabricated slighly narrower than the expected value for some reason or other, connection (1) is selected for FET 21, and (2) for FET 23 and for FET 25, to carry out the metal wirings. As a result, MOS FET having a 0.6 $\mu$m channel length is selected to execute metal wirings. Furthermore, if the channels are fabricated exactly according to the expected value without any trouble, connection (2) is selected for FET 21 and for FET 25, and (1) for FET 23, to carry out metal wirings. As a result, MOS FET 23 having a 0.5 $\mu$m channel length is selected.

In the prior art, many defective chips result because of the variation in output delay characteristics which are very sensitive to the finished values of the channel length. According to these embodiments, however, these chips stay intact without defect, thus improving the fabrication yield enormously. Also, the fabrication variations which arise from each process is reduced practically so that the design of elements or element groups can be carried out easily. These effects will be more remarkable as submicron processes are developed.

FIG. 6 is a block diagram of a circuit having, what is called, critical path blocks which are fabricated according to one method of this invention. In general, the critical path block is characterized by the fact that the fabrication yield is very sensitive to the element delay characteristic. One example of this circuit block is the carry transfer circuit contained in a 32 bit adder-substracter block. In order to fabricate a circuit block having critical paths according to this invention, circuit blocks 27 and 29 should be designed and formed on a wafer in advance. Each block 27 and 29 has the same function. The elements of which blocks 27 and 29 are composed slightly vary the shapes. For example, in the case of this embodiment, the channel length of each MOS FET in block 27 is designed and fabricated slightly wider than that of the corresponding MOS FET in block 29. Then, the input and output of either one of the blocks is selected to carry out the metal wiring so as to accomplish required functions and required speed characteristics. Power sources and ground sources of FETs in a block which have not been selected for the metal wiring can be connected to each other to prevent wrong operations.

Figure 7:
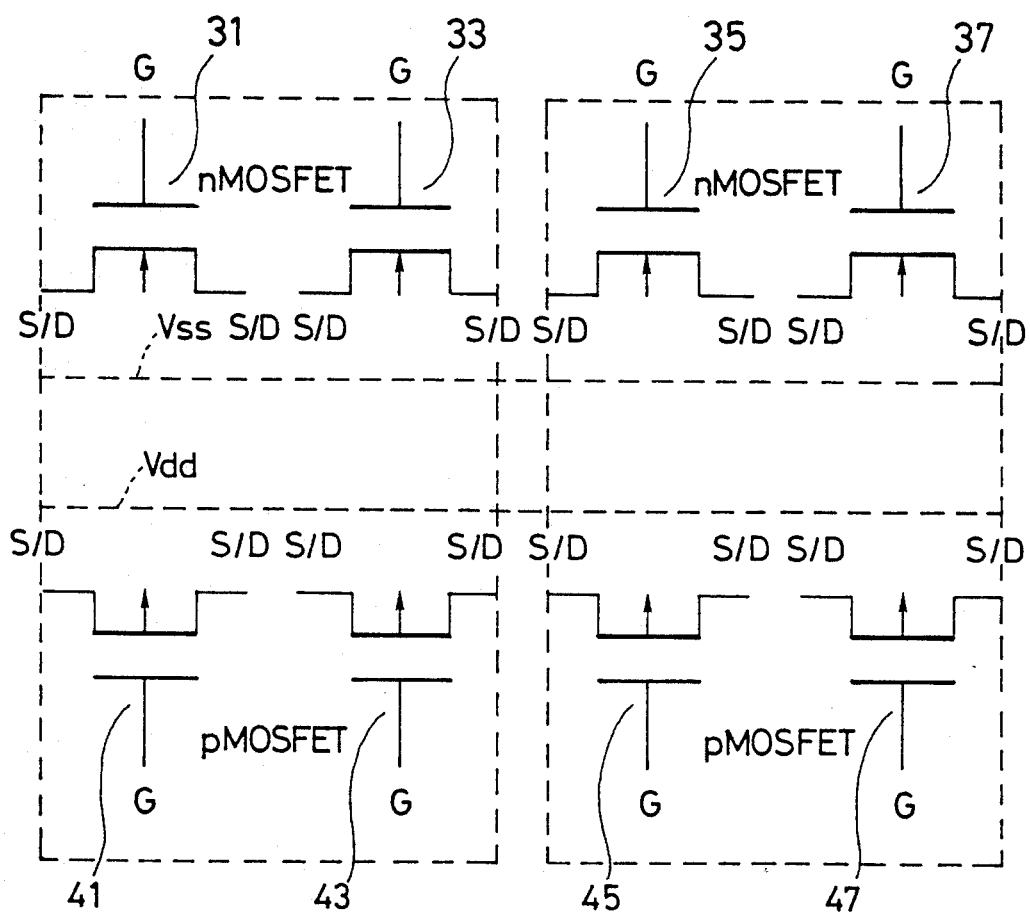
FIG. 7 shows the equivalent circuit of basic cells which are formed on a chip before the wiring steps according to one fabrication method of the present invention.
Figure 8:
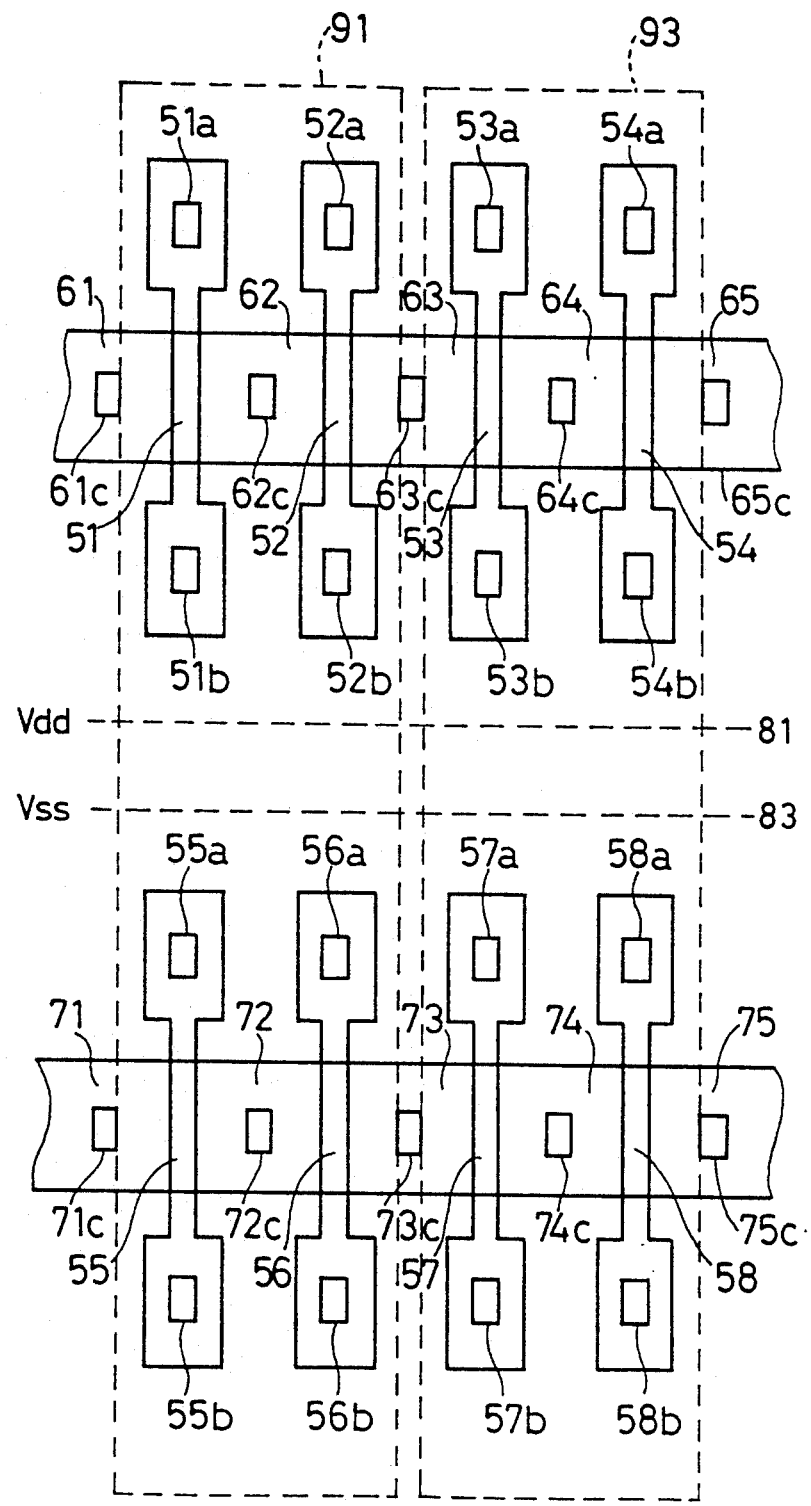
FIG. 8 shows the patterns of the basic cells corresponding to the equivalent circuit shown in FIG. 7.
Figure 9:
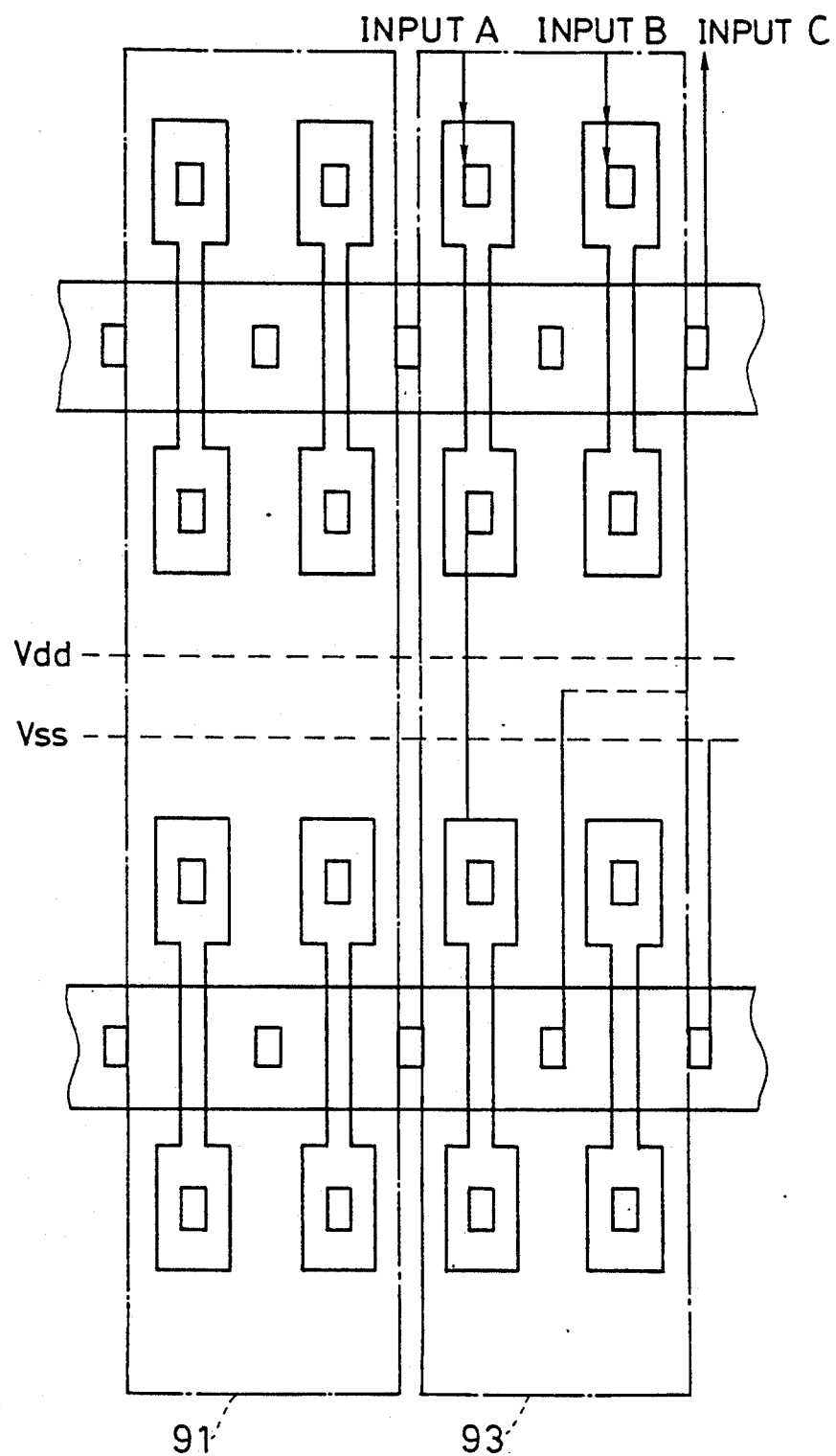
FIG. 9 is a diagram showing a circuit pattern in which wirings are executed to make two input NAND gates in the pattern shown in FIG. 8.

FIGS. 7, 8, and 9 illustrate the structure of the LSI product called the master slice LSI or gate array LSI, which is fabricated by the method of this invention. The basic cell used in this LSI is comprised of two p-channel type MOS FETs (pMOS FET) and two n-channel type MOS FETs (nMOS FET). A logic gate, such as a NAND gate, can be formed from these MOS FETs by executing inter-connections among these MOS FETs.

FIG. 7 shows the equivalent circuit of the basic cell, which has not undergone the wiring process of this invention. The device structure shown in FIG. 7 is a CMOS type structure. The basic cell is comprised of the first group of 4 MOS FETs 31, 33, 41, and 43, each of which has a relatively wider channel length, and the second group of 4 MOS FETs 35, 37, 45, and 47, each of which has a relatively narrower channel length. In these MOS FETs, numbers 31, 33, 35, and 37 represent nMOS FETs and numbers 41, 43, 45, and 47 represent pMOS FETs. In this embodiment, a plurality of the basic cells is formed on a chip in advance, and the proper elements in the cells are connected selectively to accomplish required logic circuits.

FIG. 8 shows patterns of basic cells corresponding to the equivalent circuit shown in FIG. 7. Although the gate array process using multi-layer wirings, (for example, more than 3 layers), has been highly developed recently, a process having only two layers of metal wirings will be explained as an example in this embodiment. However, this invention is not limited only to the use of two layers of metal wirings, rather, it can also be used in a process having more than three layers of metal wirings.

In FIG. 8, patterns 51 to 58 show poly-silicon regions, each of which has connection parts in both ends. These patterns can be connected to the first metal layer selectively through the connection parts, i.e., $51a$ to $58a$ and $51b$ to $58b$. In the figure, numbers 61 to 65 indicate diffusion layers, at which sources and drains of n-MOS-FETs are formed, and also numbers 71 to 75 indicate diffusion layers at which sources and drains of p-MOS-FETs are formed. Sources and drains of selected MOSFET groups are connected to the first metal layer through connection parts $61c$ to $65c$ and $71c$ to $75c$. Wirings 81 and 83 indicate a power line and an earth line formed by the second metal layer.

FIG. 9 shows patterns of two-input NAND gates which are formed from the basic cells shown in FIG. 8 by wiring them properly. In these gates, C is output as the result of NAND logic from inputs A and B. The fabrication of these gates are comprised of the following three steps. First, before the processing wafer has undergone the metal wiring step, the dimension of a poly-silicon region, which corresponds to the gate length, is measured optically or electrically so as to detect whether the actual length is wider or narrower than the expected value. In this case, let the actual dimension be wider than the expected value. Second, according to the obtained knowlege regarding the dimension of the poly-silicon region, MOSFET group 93 in which each element has a relatively short channel length, is selected as the data to make a mask for the following wiring step and to make the required logic circuits. Third, the wiring pattern to construct a NAND gate from the selected MOSFET group 93 is generated and the mask for the following wiring step is made from the pattern. This mask is then applied to the wiring step of the wafer in order to obtain a NAND logic circuit. Thus, in this NAND gate, the real finished value of the channel length is almost the same as the standard value. The third step mentioned above is a part of the gate array forming steps in prior arts. In FIG. 9, the wirings shown by solid lines are connected to the first metal layer, while the wirings shown by broken lines are connected to the second metal layer.

In the embodiment explained above, only one of the two-input NAND gates is formed on the wafer. In actual gate array products, however, tens of thousands to hundreds of thousands of such gates are formed on one chip to make a large scale of logic circuit system. It is apparent that this invention can be applied easily to such a large scale system.

Furthermore, the embodiment can be developed easily for the following technique. In gate arrays of an LSI, in order to construct a logic circuit portion which is very critical in its operating speed, only cells in which the channel length causes high speed operation are selected to wire. On the other hand, in order to construct a logic circuit portion which is not critical in its operating speed, other cells are selected to wire without giving consideration to the channel length. As a result of the technique mentioned above, the percentage of used cells in a gate array increases with ensuring against high speed operation. The yield of non-defective chips can also be improved.

In summary, even if the characteristic variations among elements are large due to the fabrication variation of element shapes in an LSI having undergone fine processes, in order to construct the last circuit products according to the present invention, the most standard elements or those more expected among finished elements can be selected to wire. Therefore, the fabrication yield in the present invention can be greatly improved, and also the range of variation among electrical characteristics of elements can be considerably limited. As a result, elements and circuits can be easily designed to reduce the development period. So, a large number of LSIs having the same electrical characteristics can be provided with a high fabrication yield. Especially in LSIs made by the master slice approach and the gate array approach, several kinds of basic cells in which the gate length of each element is slightly different, are provided in advance according to the present invention. Among finished elements, in order to fabricate required products, then, cells having the most standard element shapes or the element shapes expected in the design stage are detected to execute selective wirings. So, even if variations in element characteristics are large in the approaches due to the fabrication variation among element shapes, the variation among the limits of operation speed for the finished products can be made small to greatly improve the fabrication yield.

Various modifications will become possible for those skilled in the art after receiving the teachings of the present disclosure without departing from the scope thereof.

What is claimed is:

1. A method for fabrication of semiconductor circuits by forming semiconductor elements on a semiconductor substrate and by wiring and connecting said semiconductor elements, the method comprising the steps of:
    (a) forming a plurality of semiconductor elements on said substrate, each semiconductor element of said plurality of semiconductor elements having a different specific dimension;
    (b) measuring the specific dimension of each of said semiconductor elements which is formed on said substrate; and
    (c) wiring and connecting said semiconductor elements selectively according to data based on the specific dimension of each of the semiconductor elements obtained by said measuring step;
wherein the specific dimension is a gate length or channel length and each of the plurality of semiconductor elements has a different gate length or channel length formed in said forming step (a).

2. The method as claimed in claim 1, wherein the dimensions of each of the semiconductor elements formed on the substrate are measured by an optical or electrical method in said measuring step (b).

3. The method as claimed in claim 1, wherein a particular metal mask is selected according to said measured data in order to execute wirings and connectings using said metal mask in said step (c).

4. A method for the fabrication of semiconductor circuits by forming semiconductor transistors on a semiconductor substrate and by wiring and connecting said semiconductor transistors, the method comprising the steps of:
    (a) forming a plurality of MOS semiconductor transistors on said semiconductor substrate, each MOS semiconductor transistor having a different specific dimension of a channel length;
    (b) measuring the channel lengths of said MOS semiconductor transistors which are formed on said substrate;
    (c) selecting a metal mask according to measured data of the channel lengths obtained in the measuring step (b); and
    (d) wiring and connecting said MOS semiconductor transistors selectively using said selected metal mask.

5. The method as claimed in claim 1, wherein the step (a) of forming the plurality of MOS semiconductor transistors further comprises a well forming step, an element isolation step and a channel forming step, and wherein said measuring step (b) is executed on the MOS semiconductor transistors to be monitored once said channel forming step has been completed.

6. The method as claimed in claim 1, wherein a first metal mask is selected to use for selective wirings and connetings in said step (d).

7. The method as claimed in claim 4, wherein the step of forming the plurality of MOS semiconductor transistors further comprises a well forming step, an element isolation step, a channel forming step, a source-drain forming step, a contact hole forming step, and a first metal wiring step, and wherein said measuring step (b) is executed on the MOS semiconductor transistors to be monitored once said first metal forming step has been completed.

8. The method as claimed in claim 1, wherein a second metal mask is selected to use for selective wirings and connectings in said step (d).

9. The method as claimed in claim 1, wherein the channel length is measured optically in said step (b).

10. The method as claimed in claim 1, wherein the measuring step (b) comprises measuring current-voltage characteristics of said MOS semiconductor transistors to derive information regarding the channel lengths from a driving ability of said MOS semiconductor transistors.

11. The method as claimed in claim 1, wherein the measuring step (b) comprises measuring a resistivity of a poly-silicon layer which forms a channel of said MOS semiconductor transistors by a monitoring circuit in order to derive said channel length.

* * * * *